United States Patent
Täuber et al.

(10) Patent No.: US 7,177,999 B2
(45) Date of Patent: Feb. 13, 2007

(54) READING EXTENDED DATA BURST FROM MEMORY

(75) Inventors: Andreas Täuber, Unterschleibheim (DE); Paul Schmölz, Munich (DE)

(73) Assignee: Infineon Technologies AG (DE)

( * ) Notice: Subject to any disclaimer, the term of this patent is extended or adjusted under 35 U.S.C. 154(b) by 238 days.

(21) Appl. No.: 10/425,002

(22) Filed: Apr. 28, 2003

(65) Prior Publication Data
US 2004/0052115 A1    Mar. 18, 2004

(30) Foreign Application Priority Data
Apr. 30, 2002  (DE) ................ 102 19 370

(51) Int. Cl.
*G06F 12/00* (2006.01)
(52) U.S. Cl. .............. 711/168; 711/105; 711/167; 365/189.04; 365/233; 365/239
(58) Field of Classification Search ............ 711/5, 711/105, 163, 167–169; 365/189.04, 230.03, 365/233, 239
See application file for complete search history.

(56) References Cited

U.S. PATENT DOCUMENTS

| | | | | |
|---|---|---|---|---|
| 5,828,423 A | * | 10/1998 | Serizawa et al. | 348/699 |
| 6,044,026 A | * | 3/2000 | Morgan | 365/194 |
| 6,175,526 B1 | * | 1/2001 | Morgan | 365/194 |
| 6,314,048 B1 | * | 11/2001 | Ishikawa | 365/230.06 |
| 6,333,889 B1 | * | 12/2001 | Arimoto | 365/230.03 |
| 6,469,940 B1 | * | 10/2002 | Tsuda | 365/189.05 |

OTHER PUBLICATIONS

Marc Haberland, "Synchrone laufen schneller, Funktionsweise und Technologie synchroner DRAMs," Elektronik, vol. 19, pp. 113-119 (1995).

* cited by examiner

*Primary Examiner*—Mano Padmanabhan
*Assistant Examiner*—Jasmine Song
(74) *Attorney, Agent, or Firm*—Fish & Richardson P.C.

(57) ABSTRACT

A method for reading, from a semiconductor memory, data having a data burst length greater than two includes, beginning at a first time, receiving, on an address bus, a first address part associated with memory cells to be addressed. At a second time that is later than the first time, a read command is placed on a command bus to initiate read access to the first memory cells and a second address part associated with memory cells to be addressed is received on the address bus. Beginning at a third time that is later than the second time, data associated with the first and second address parts is transferred to a data bus.

8 Claims, 2 Drawing Sheets

READING EXTENDED DATA BURST FROM MEMORY

FIELD OF INVENTION

This invention relates to semiconductor memories, and in particular, to reading from such memories data bursts that extend over more than one clock cycle.

RELATED APPLICATIONS

This application claims the benefit of the Apr. 30, 2002 filing date of German application DE 102.19.370.3, the contents of which are herein incorporated by reference.

BACKGROUND

Read latency is increasingly a problem for semiconductor memories operated at high frequency. Particularly for fast network memories intended to act, by way of example, for the purpose of temporary buffer-storage of a 10 Gbit/s data stream over a few milliseconds, semiconductor memories in which data are output as closely as possible to the time of the read command are required. The read latency, which represents the period of time which elapses between the read command and the first data bit on the data bus, is comparatively high, particularly in the case of DRAM memory architectures. Buffer-stores used for a network processor unit (NPU) are therefore often SRAM memory chips, which have relatively low read latency. However, such SRAM memory chips have the drawback that they cannot be produced using very large scale integration and are therefore comparatively expensive.

SUMMARY

In view of these problems, it is an object of the invention to specify a method for reading data from a semiconductor memory apparatus which allows the read latency to be reduced and therefore relaxed.

In line with the invention, a method for reading data with a data burst length BL>2 from a semiconductor memory apparatus comprises the following steps:

a first address part for memory cells which are to be addressed in the semiconductor memory apparatus is received from an address bus in the semiconductor memory apparatus at a time $t_0$;

a read command is transferred to a command bus in the semiconductor memory apparatus in order to initiate read access to the memory cells at a time $t_1$, which is later in time than the time $t_0$;

a second address part for the memory cells which are to be addressed is received from the address bus at the time $t_1$; and data associated with the addressed memory cells are transferred to a data bus in the semiconductor memory apparatus at a time $t_2$, which is later than the time $t_1$.

The inventive method allows the read latency to be relaxed for semiconductor memory apparatuses which are read with a data burst length BL>2. In this context, a burst length of >2 means that data are output during at least two clock periods of a clock signal in the semiconductor memory apparatus. A fundamental feature of the inventive method is that some of the address of memory cells which are to be addressed is received in the semiconductor memory apparatus from the address bus for the purpose of decoding the address before the actual read command which initiates read access. In this regard, the first address part is made available on the address bus early enough before the read command for the first address part to be able to be received from the address bus before the actual read command. In particular, row and column decoding devices in the semiconductor memory apparatus may already have obtained the first address part at a time at which there is still no associated read command on the command bus. At the time $t_0$, the first address part is thus "fetched" or received from the address bus while the second address part is "fetched" or received at the later time $t_1$. The cell array in the semiconductor memory apparatus can thus actually be accessed one clock cycle before the read command, for example.

Conventionally, methods for reading data from semiconductor memory apparatuses with burst lengths BL>2 in the address bus (and command bus) involve an "NOP" (no operation) being executed between two successive access operations when full use is to be made of the data bus's time. The address bus is thus not in optimum use between successive read access operations to the cell array in the semiconductor memory apparatus.

In line with the invention, at least some of the full addresses of memory cells which are to be addressed are received before the actual read command. This allows the semiconductor memory apparatus's read latency to be shortened, which results in novel areas of use for such a semiconductor memory apparatus, particularly as a buffer-store for an NPU.

Preferably, the semiconductor memory apparatus is a DRAM, particularly an "RLDRAM" (reduced latency DRM). The data are preferably provided on the data bus at double data rate, which means that a "DDR" memory chip is involved.

The method preferably comprises the step of generating a cyclic clock signal, and the address parts and the read command are transferred and received at times of edges of the clock signal. Preferably, the address parts and the read command are transferred and received at times of rising edges of the clock signal. The address information is preferably available on the address bus during one clock cycle. By way of example, the address parts are provided on the address bus for one clock period from the time of a falling edge of the clock signal onward and are received in the semiconductor memory apparatus from the address bus upon the next rising edge of the clock signal.

Preferably, the time $t_0$ is one clock cycle before the time $t_1$. This means that the first address part is actually received one cycle before the actual read command. The second address part is preferably received from the address bus at the time of the read command, i.e. at the time $t_1$. Hence, "prefetch addressing" of the memory cells which are to be addressed takes place before the actual read command.

The first address part preferably comprises row addresses. On account of the "rectangular" cell array architectures often used with DRAM memory concepts, activating ("opening") rows in the memory cell array often requires more time than activating ("opening") columns. Hence, at least some of the row addresses in the first address part, which is transferred before the actual read command, are preferably transferred, which means that more time is available to activate or open them. In this case, the column addresses are preferably transferred with the second address part, since activating these takes less time.

Preferably, the first address part comprises bank addresses and at least some block addresses. By way of example, one preferred memory architecture comprises 8 banks with 16 blocks each. Preferably, the bank addresses (for example 3 bit addresses for 8 banks) and at least some of the block addresses (for example 2 bits of 4 bit addresses) are actually transferred with the first address part. In this case, the rest of the block addresses are transferred with the second address part.

Preferably, the second address part comprises the column addresses of the memory cells which are to be addressed. Since the time needed for activating or opening rows is longer in typical DRAM memory architectures (rectangular cell array) than the corresponding activation time for columns, it is also possible to transfer the column addresses in the second address part, which is later in time, without increasing the read latency.

Preferably, the second address part comprises at least some block addresses. As already illustrated above, provision can be preferably be made for some of the block addresses actually to be transferred with the first address part. The rest of the block addresses (for example 2 bits of 4 bit block addresses) are transferred with the second address part.

BRIEF DESCRIPTION OF THE DRAWINGS

The invention is described below by way of example with reference to preferred embodiments and accompanying drawings, in which.

DETAILED DESCRIPTION

Figure 1:
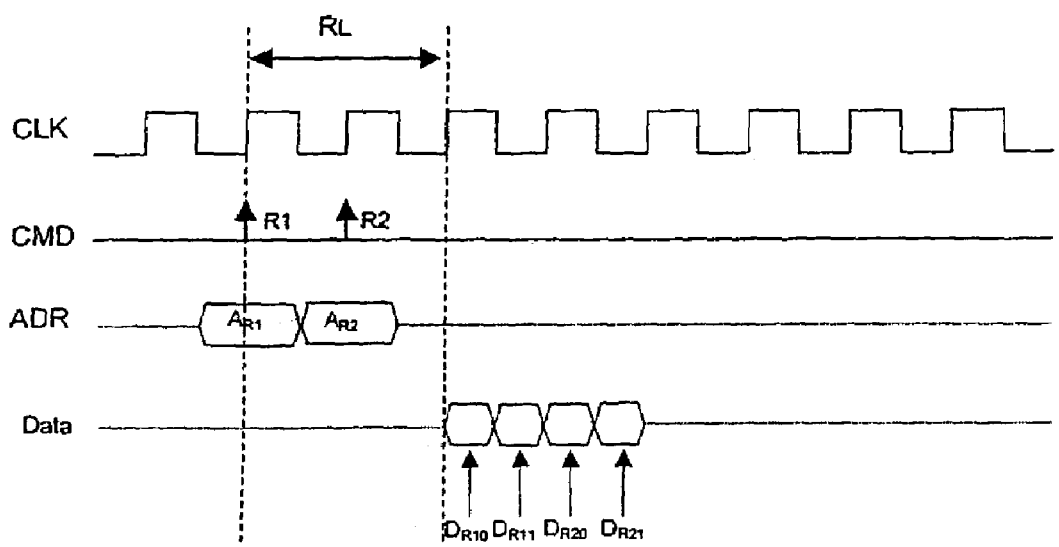
FIG. 1 shows a known method for reading data from a semiconductor memory apparatus with a burst length BL=2.

FIG. 1 shows a schematic timing diagram for a conventional method for reading data from a semiconductor memory apparatus. "CLK" denotes a clock signal, "CMD" denotes the command bus, "ADR" denotes the address bus and "data" denotes the data bus. To simplify understanding, FIG. 1 (and the rest of the figures) shows only the command, address and data signals for two read commands (R1, R2).

A read command R1 is shown by an arrow on the command bus CMD. The read command is executed simultaneously with a rising edge of the clock signal CLK. During a clock cycle from one falling edge to the next falling edge of the clock signal, address information $A_{R1}$ is available on the address bus ADR and is received from the address bus ADR at the time of the read command R1 for the purpose of address decoding. The first data bit is provided on the data bus after a read latency RL of two clock periods, i.e. after a delay time of two clock periods following the read command R1. The data associated with the first read command R1 are provided on the data bus at double data rate (DDR). The data $D_{R10}$ and $D_{R11}$ are thus transmitted on the rising and falling edges within a clock signal period.

The timing diagram in FIG. 1 shows that, for a burst length BL=2, when the data bus is in full use (information written to the data bus all the time), the address and command buses are also in full use. Address information $A_{R2}$ for a subsequent read command R2 is thus transferred directly after the addresses $A_{R1}$. In other words, the addresses $A_{R2}$ for the second read command R2 are provided on the address bus ADR during a clock cycle which directly follows the clock period in which the address information $A_{R1}$ for the first read command R1 was provided.

This situation takes a different turn with a known method for reading data from a semiconductor memory apparatus in which a burst length BL=4 is used. If full use is to be made of the data bus in this case, i.e. the data $D_{R1[0:3]}$ and the data $D_{R2[0:3]}$ are intended to follow one another directly in time, then full use can no longer be made of the address bus ADR's time. Instead, a "dead time" results on the address bus ADR between the transferred addresses $A_{R1}$, which are associated with the first read command R1, and the addresses $A_{R2}$, which are associated with the second read command R2. During this dead time (NOP), no address information is provided on the address bus.

Figure 2:
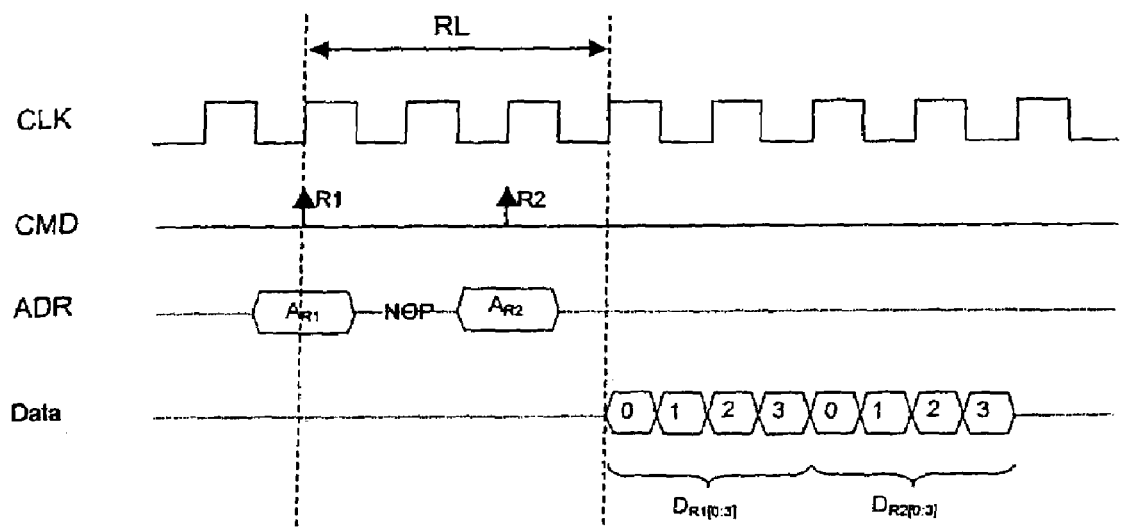
FIG. 2 shows a schematic timing diagram for a known method for reading data from a semiconductor memory apparatus with a burst length BL=4.
Figure 3:
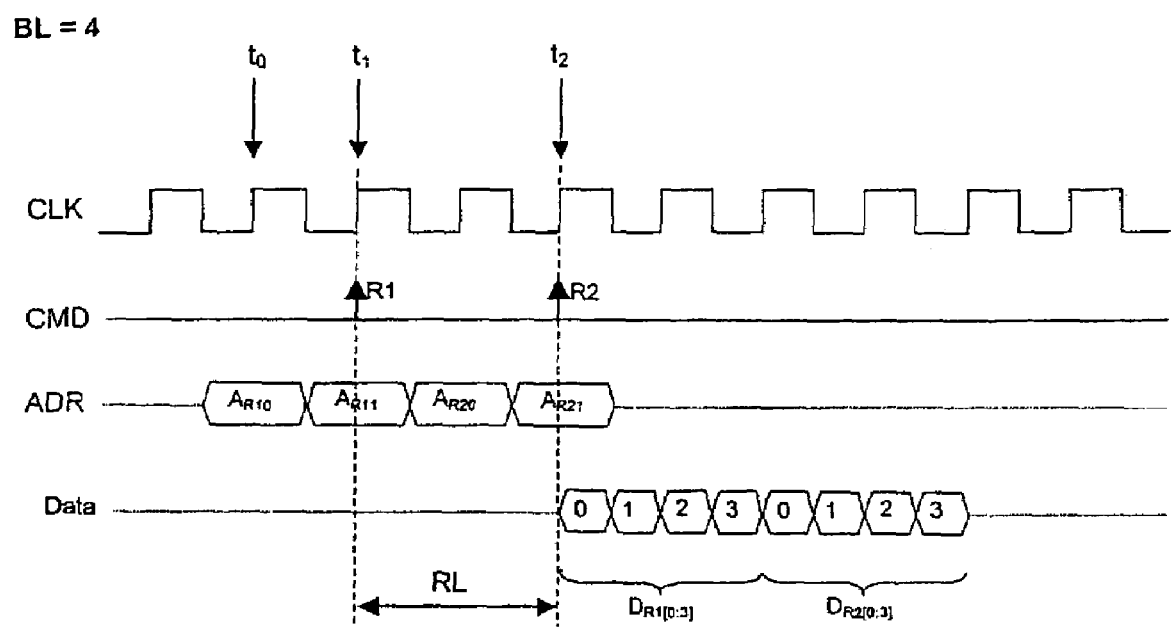
FIG. 3 shows a timing diagram for a preferred inventive method for reading data from a semiconductor memory apparatus with a burst length BL=4.

A preferred inventive method for reading data from a semiconductor memory apparatus is shown in FIG. 3. In the case of this embodiment, data are read with a burst length of BL=4. The data are provided on the data bus at double data rate (DDR), which means that full use is made of the data bus's time, i.e. information is written to it all the time. Unlike the method described in connection with FIG. 2, however, the method illustrated in FIG. 3 involves full use being made of the address bus ADR's time. In the preferred method, a first address part $AR_{10}$, which is associated with the first read command R1, is received in the semiconductor memory apparatus from the address bus ADR at a time $t_0$ before the read command R1 is applied to the command bus CMD. Hence, the first address part $A_{R10}$ is actually received one clock cycle before the read command R1, which is executed at a time $t_1$. At the time $t_1$, which is one clock period after the time $t_0$, the second address part $A_{R11}$ for the first read command R1 is received. The first and second address parts $A_{R10}$ and $A_{R11}$ are respectively provided on the address bus ADR for one clock period half a clock period before the reception times $t_0$ and $t_1$.

The read latency RL, denoting the period of time between read access and the first data bit on the data bus, can be reduced by one cycle as a result of this "prefetch addressing". Accordingly, the read latency RL is 2 in the inventive embodiment illustrated in FIG. 3, whereas RL=3 in the case of the conventional reading method in FIG. 2. The data $D_{R1[0:3]}$ associated with the first read command R1 are provided on the data bus at double data rate from the time $t_2$ onward. Full use of the address bus ADR's time allows a reduction in the read latency to be achieved as a result of reception of a first address part $A_{R10}$ (or generally $A_{RX0}$) before the actual associated read command R1 (or generally RX).

A description will now be given of an adaptation of the inventive reading method to an 8×2×16 Mbit DRAM memory array. Row addressing (WL selection) requires, by way of example, 3 bits for bank addresses, 4 bits for block addresses and 9 bits for row addresses. If there are 13 signals available, 3 bits+2 bits+9 bits thereof can actually be transferred one clock cycle earlier. Hence, by way of example, all the bank addresses BANK<2:0> and all the row addresses AROW<8:0> can actually be transferred with the first address part. However, the blocks BLOCK<3:0> are addressed by the first address part only incompletely, since just 2 bits of 4 bits of the block addresses are transferred. The result of this is that 4 rows (WS) need to be opened in one bank, with the word line which is to be opened not being able to be selected until the last 2 bits of the block addresses have been transferred. Alternatively, the word lines can also be opened first, with the rest of the addresses (2 bits) being taken into account only when the MDQS switch opens (i.e.

when the columns are read). The latter addresses are thus converted into one column address as it were.

The advantages of the inventive method are particularly a reduction in the read latency by one clock cycle, which is of particular significance for low frequencies. Even if a full address is not available for opening a WL, then at least some of the address decoding can be brought forward. In addition, the number of address pins is reduced by a factor of two.

The invention claimed is:

1. A method for reading, from a semiconductor memory, data having a data burst length greater than two, the method comprising:
    beginning at a first time, receiving, on an address bus of the semiconductor memory, a first address-part associated with memory cells to be addressed;
    placing no command on a command bus of the semiconductor memory to initiate read access to the memory cells to be addressed until a second time that is later than the first time, wherein at the second time, placing a command on the command bus of the semiconductor memory to initiate read access to the memory cells to be addressed;
    at the second time, receiving, on the address bus, a second address-part associated with the memory cells to be addressed; and
    beginning at a third time that is later than the second time, transferring, to a data bus of the semiconductor memory, data associated with the first and second address-parts.

2. The method of claim 1, further comprising selecting the semiconductor memory to be a reduced-latency dynamic random-access memory.

3. The method of claim 1, further comprising providing a cyclic clock signal having cycles defined by edges, and wherein placing a read command on a command bus occurs at an edge of the clock signal, wherein receiving a first address-part occurs at an edge of the clock signal, and wherein receiving a second address-part occurs at an edge of the clock signal.

4. The method of claim 3, wherein receiving the first address-part occurs one clock cycle before placing the read command on the command bus.

5. The method of claim 1, further comprising selecting the first address-part to include row addresses.

6. The method of claim 1, further comprising selecting the first address-part to include bank addresses and block addresses.

7. The method of claim 1, further comprising selecting the second address-part to include column addresses.

8. The method of claim 1, further comprising selecting the second address-part to include block addresses.

* * * * *